(12) United States Patent
Miyao et al.

(10) Patent No.: US 9,708,221 B2
(45) Date of Patent: Jul. 18, 2017

(54) BRICK, TILE, FLOORBOARD, CEILING PANEL, AND ROOFING MATERIAL, AND METHOD FOR MANUFACTURING SAME

(71) Applicants: MITSUISHI TAIKA RENGA CO., LTD., Bizen-shi, Okayama (JP); DOWA F-TEC CO., LTD., Kume-gun, Okayama (JP); DOWA ELECTRONICS MATERIALS CO., LTD., Chiyoda-ku, Tokyo (JP)

(72) Inventors: Yasumichi Miyao, Bizen (JP); Toshiya Kitamura, Okayama (JP); Yasunobu Mishima, Okayama (JP)

(73) Assignees: MITSUISHI TAIKA RENGA CO., LTD., Bizen-shi, Okayama (JP); DOWA F-TEC CO., LTD., Kume-gun, Okayama (JP); DOWA ELECTRONICS MATERIALS CO., LTD., Chiyoda-ku, Tokyo (JP)

( * ) Notice: Subject to any disclaimer, the term of this patent is extended or adjusted under 35 U.S.C. 154(b) by 0 days.

(21) Appl. No.: 14/901,570

(22) PCT Filed: Feb. 25, 2014

(86) PCT No.: PCT/JP2014/054567
§ 371 (c)(1),
(2) Date: Dec. 28, 2015

(87) PCT Pub. No.: WO2014/208124
PCT Pub. Date: Dec. 31, 2014

(65) Prior Publication Data
US 2016/0368824 A1    Dec. 22, 2016

(30) Foreign Application Priority Data

Jun. 28, 2013 (JP) ................. 2013-136015

(51) Int. Cl.
| | | |
|---|---|---|
| C04B 35/26 | (2006.01) | |
| H05K 9/00 | (2006.01) | |
| C04B 35/64 | (2006.01) | |
| E04B 1/92 | (2006.01) | |

(52) U.S. Cl.
CPC ............ *C04B 35/26* (2013.01); *C04B 35/64* (2013.01); *E04B 1/92* (2013.01); *H05K 9/0003* (2013.01); *C04B 2235/3272* (2013.01); *C04B 2235/349* (2013.01); *C04B 2235/602* (2013.01); *C04B 2235/6567* (2013.01); *C04B 2235/77* (2013.01); *C04B 2235/96* (2013.01); *E04B 2001/925* (2013.01)

(58) Field of Classification Search
CPC ................. C04B 2235/3272; C04B 35/26
See application file for complete search history.

(56) References Cited

U.S. PATENT DOCUMENTS

| | | | |
|---|---|---|---|
| 3,145,184 A | | 8/1964 | Schumann et al. |
| 3,437,602 A | * | 4/1969 | Rosensweig ............ G21F 1/103 252/478 |
| 6,045,628 A | * | 4/2000 | Solntsev .................. C23C 8/10 148/281 |
| 6,495,845 B1 | | 12/2002 | Tsunota et al. |
| 7,704,907 B2 | * | 4/2010 | Guenther ................ B09B 3/005 501/155 |

FOREIGN PATENT DOCUMENTS

| | | |
|---|---|---|
| CN | 1080626 A | 1/1994 |
| CN | 102153333 A | 8/2011 |
| EP | 2546210 A2 | 1/2013 |
| JP | S57-016397 A | 1/1982 |
| JP | S59-214799 A | 12/1984 |
| JP | S63-206348 A | 8/1988 |
| JP | H01-264950 A | 10/1989 |
| JP | H04-144953 A | 5/1992 |
| JP | H10-079308 A | 3/1998 |
| JP | H11-040408 A | 2/1999 |
| JP | 2001-99941 A | 4/2001 |
| JP | 2002-267792 A | 9/2002 |
| JP | 2006-518446 A | 8/2006 |
| JP | 2013-224933 A | 10/2013 |

* cited by examiner

*Primary Examiner* — Noah Wiese
(74) *Attorney, Agent, or Firm* — Fox Rothschild LLP

(57) ABSTRACT

Provided are an inexpensive brick, etc., naturally exhibiting excellent radiation shielding effects, demonstrating high strength while being chemically stable and not including harmful substances, and also being suitable for use in facility in which devices affected by magnetic fields are installed. Manufactured are a brick, etc., for constructing a γ-shielding structure or constructing an X-ray shielding structure, in which a molding material including hematite in a ratio of at least 90% by mass is molded into a predetermined shape to obtain a molded article, and the molded article is fired, whereby the fired molded article is endowed with a bulk density of at least 2.8 g/cm3, and the fired molded article is endowed with a residual magnetization of 1.0 $A \cdot m^2 \cdot g^{-1}$ or less.

9 Claims, No Drawings

BRICK, TILE, FLOORBOARD, CEILING PANEL, AND ROOFING MATERIAL, AND METHOD FOR MANUFACTURING SAME

TECHNICAL FIELD

The present invention relates to a molded article (brick, tile, floorboard, ceiling panel, and roofing material) for structure construction and a method for manufacturing the molded article for structure construction.

BACKGROUND ART

In recent years, shielding of radiation generated from wastes contaminated with radioactive substances has become an urgent issue. In various facilities such as advanced medical facilities and materials research facilities that use high-energy radiation emitted from radioactive elements, accelerators, or other sources, equipment and facilities themselves need to be protected to shield radiation. As ingredients of radiation shielding materials to shield radiation, materials with high density, including lead, iron, and concrete are considered to be effective. However, these materials have the following problems.

Although lead provides high radiation shielding effects and chemical stability, there is the problem that lead is toxic. Another problem is that lead is low in hardness which makes it soft even at a room temperature. When using lead to the location that requires strength, some sort of reinforcement member is necessary. Yet another problem is that lead has a low melting point at 327.4° C. Lead cannot retain the form as a structure under an environment of high temperature because of the low melting point.

Iron also has a problem in the limited use environment because of its low resistance to corrosion. Iron is hard to use in a salty and moist environment such as a coastal area. In addition, iron cannot be prevented from degrading over time because of rusting even under a normal environment. This means that iron is not suitable for the use as a radiation shielding material to shield isolation facilities of radioactive wastes. The reason is that maintenance of this type of isolation facilities cannot be conducted frequently because of the limited access to the facilities while such facilities are assumed to be used for a long period of time, from a few decades to a hundred years.

Concrete also has a problem in its lower density. The density is lower than, for example, the aforementioned lead and iron. In order to obtain sufficient radiation shielding effects, structures made of concrete such as a wall must be very thick. Although there is a type of concrete called "heavy concrete", the density of which is increased by adding high-density aggregates, radiation shielding effects are still insufficient. Another problem of heavy concrete is that it contains pieces of metal and oxides as aggregates, which significantly reduces the mechanical strength and chemical stability of heavy concrete. Therefore, heavy concrete is also not suitable for the use as a radiation shielding material to shield such isolation facilities as mentioned above.

In the meantime, some technologies have been proposed for improving radiation shielding effects of concrete, mortar, or the like by increasing density through adding ferrite (for example, refer to Patent Literatures 1 and 2). Ferrite is a type of magnetic material that contains iron oxides and is widely used in various kinds of electronic components including motor magnets, toner drums for photocopying machines and laser printers, magnetic disks, and magnetic tapes. The radiation shielding materials in Patent Literatures 1 and 2 focus on the high density (radiation shielding effects) rather than the magnetic properties. In order to build a radiation shielding structure using the technologies of Patent Literatures 1 and 2, it is necessary to go through the following operations of (1) setting up a form, (2) arranging rebars in the form, (3) pouring concrete or mortar in the form, (4) curing the concrete or mortar, and (5) removing the form. The problem is that the series of such operations entail labor, time and costs.

Considering such circumstances, the applicant of the present invention has developed a molded article for structure construction with enhanced radiation shielding effects in which the molding material containing ferrite powder in a ratio of 60% by mass or more is molded into a predetermined shape and fired, whereby the fired molded article has a density of 3.5 g/cm$^3$ or higher. A related patent application has already been filed as Japanese Patent Application No. 2013-057194. Note that a molded article for structure construction means the article such as a brick and a tile that is stacked, assembled, or bonded to one another to form a shielding structure in a construction, for example, a wall, a ceiling, and a floor. The ferrite powder used for this molded article for structure construction is preferably the one expressed by the compositional formula: $AO.nX_2O_3$, where A is at least one type of element selected from among magnesium (Mg), calcium (Ca), manganese (Mn), cobalt (Co), nickel (Ni), copper (Cu), strontium (Sr), barium (Ba), and lead (Pb), and X is at least one type of element selected from among iron (Fe), cobalt (Co), and nickel (Ni) while n is a mole ratio defined as a real number from 1 to 9.

This molded article for structure construction not only exhibits excellent radiation shielding effects but also demonstrates high strength and excellent workability. However, this molded article for structure construction has a problem in that it is not suitable for use in a facility in which equipment susceptible to magnetic fields, such as precision analytical equipment and measuring equipment, is installed. The reason is that the molded article for structure construction that contains ferrite expressed in the aforementioned compositional formula, which typically indicates hard ferrite, could adversely affect the aforementioned equipment, because it becomes permanent magnet once exposed to an external magnetic field and continues to generate the magnetic field even after the external magnetic field is eliminated.

Patent Literature 3 is another example that describes a construction structure with heavy media additives including hematite, lead, and iron, added to a layer made of concrete as a part of a structure of construction such as a wall and a ceiling (refer to Claim in Patent Literature 3). Patent Literature 3 also describes that addition of such heavy media additives increases radiation shielding effects of a construction structure (refer to Paragraph 0020 in Patent Literature 3). In the construction structure of Patent Literature 3, however, the layer to add such heavy media additives as hematite is mainly composed of concrete that is mixed in the construction site. Therefore, the construction structure of Patent Literature 3 does not go much beyond the aforementioned heavy concrete in radiation shielding effects, which is not sufficient. Another problem is that the construction entails much labor, time and costs such as setting frames.

CITATION LIST

Patent Literature

Patent Literature 1: Japanese Laid-Open Patent Application Publication No. 57-016397

Patent Literature 2: Japanese Laid-Open Patent Application Publication No. 2002-267792

Patent Literature 3: Japanese Translation of PCT Application No. 2006-518446

SUMMARY

Technical Problem

The present invention is designed in order to solve the problems described above, providing an inexpensive molded article for structure construction, naturally exhibiting excellent radiation shielding effects, demonstrating high strength while being chemically stable and not including harmful substances, and also being suitable for use in a facility in which equipment susceptible to magnetic fields is installed. The present invention also provides a method for manufacturing the molded article for structure construction.

Solution to Problem

The problems described above are solved by providing a molded article for structure construction that is obtained by molding a molding material containing hematite (compositional formula: $Fe_2O_3$) in a ratio of 80% by mass or more into a predetermined shape to obtain a molded article, and firing the molded article, so that the fired molded article has a bulk density of 2.8 g/cm$^3$ or higher. In the present invention, a molded article for structure construction means a material formed into a predetermined shape in advance to construct a structure, rather than such a material mixed in a construction site as concrete. Examples of the molded article for structure construction include a block, a brick, a panel, and a tile that is stacked, assembled, or bonded to one another to form a shielding structure of a construction, for example, a wall, a ceiling, and a floor.

Hematite, having a bulk density of 5.26 g/cm$^3$, is a substance with relatively higher density than other oxides; therefore, adding hematite to the molding material ensures the molded article for structure construction to have excellent radiation shielding effects and high bulk density after it is fired. Radiation is classified by the propagation form, the wave length (energy), the generation origin, and the like into particle waves including alpha ($\alpha$) rays, beta ($\beta$) rays, and neutron rays, and into electromagnetic waves including gamma ($\gamma$) rays and X-rays. The molded article for structure construction of the present invention can shield any of such radiation, but it particularly intends to shield $\gamma$-rays and X-rays that have strong penetrability. $\gamma$-rays and X-rays cannot be attenuated by electromagnetic interaction as they do not have an electrical charge and are electrically neutral. In order to shield $\gamma$-rays and X-rays, the use of a material with high density is critically important. For example, the bricks of the present invention can exhibit superior effects in shielding $\gamma$-rays and X-rays.

In addition, because hematite is an insulator and has no magnetism as opposed to the aforementioned ferrite, the molded article for structure construction of the present invention has little residual magnetization and is able to use suitably in the environment in which equipment susceptible to magnetic fields are installed in the vicinity. The preferred residual magnetization of the fired molded article is 1.0 A·m$^2$·g$^{-1}$ or less.

The molded article for structure construction of the present invention can also be suitably used for shielding, for example, isolation facilities of radioactive wastes because hematite contains trivalent iron ions which are chemically stable under an ordinary temperature and pressure. Furthermore, hematite, when firing, does not only change the hue from reddish brown to iron black, it can also obtain the appropriate degree of luster if distribution of particle sizes and conditions of firing are adjusted. Accordingly, the present invention can also provide the molded article for structure construction excellent in designability. Furthermore, the molded article for structure construction of the present invention is not only safe for human body but also easy to dispose of because hematite is not toxic and does not contain toxic substances. In addition, hematite is excellent in its recycling efficiency. By griding the fired compact, hematite becomes reusable not only as a material of the molded article for structure construction of the present invention but also for other products as it becomes sufficient enough for these products in purity and form. Another advantage of the molded article for structure construction of the present invention is the low manufacturing cost because there is abundant raw material for hematite that can be obtained at a low cost.

In the molded article for structure construction of the present invention, the molding of the molding material is not limited to particular methods, but preferably performed by press molding. This makes it easy to improve the compression strength of the fired molded article. Consequently, the molded article for structure construction is further improved and thereby ensures the construction of a structure far superior in its strength, for example, in the resistance against earthquakes. In addition, the radiation shielding effects can also be further enhanced. The compression strength of the fired molded article is not limited to a particular value, but preferably 100 MPa or higher, in order to prevent the molded article for structure construction from being damaged in the case where heavy load is applied to the molded article for structure construction, for instance, when building the foundation of a heavy construction such as a building.

In addition, in the molded article for structure construction of the present invention, the temperature for firing the molded article is not limited to a particular value because it varies depending on the length of the firing time or other conditions. Nevertheless, an excessively low firing temperature will obstruct the firing of the molded article, preventing the bulk density of the fired molded article from reaching a target value. Accordingly, the firing temperature of the molded article is preferably 700° C. or higher. An excessively high firing temperature of the molded article will however promote the generation of magnetite (compositional formula: $Fe_3O_4$). Magnetite does not transition to a stabilized state in the atmospheric environment, but shows properties of a good conductor, and is easily magnetized because of its high magnetic permeability, which makes it unsuitable as a molded article for structure construction of the present invention. Accordingly, the firing temperature of the molded article is preferably 1,350° C. or lower.

Furthermore, in the molded article for structure construction of the present invention, the firing time of the molded article is not limited to a particular value because it varies depending on the temperature of firing. A shorter firing time of a molded article is industrially advantageous while an excessively short firing time will not bring about sufficient firing of the molded article which makes it hard to increase the bulk density of the fired molded article. Accordingly, the firing time of the molded article is preferably 0.5 hours or more. An excessively long firing time of the molded article will decrease productivity of the molded article for structure construction. Accordingly, the firing time of the molded article is preferably 150 hours or less.

Furthermore, in the molded article for structure construction of the present invention, hematite is contained in the molding material most commonly in a powder form. The particle of hematite (or hematite powder) is not limited to a particular size because it varies depending on the later-explained additives to be added, the handling ability in molding the molding material, and the application of the obtained molded article for structure construction. Nevertheless, an excessively small particle size of the hematite powder will make the difference in the bulk density of the molded article between the unfired state and the fired state large, resulting in the occurrence of cracking, chipping, warping or the like caused by firing. This may inhibit the fired molded article from maintaining the precision of the shape and the dimensions. Because of this, the average particle size of hematite powder is preferably 0.3 μm or more. An excessively large particle size of hematite powder will however obstruct the sintering of the molded article and thereby the bulk density of the fired molded article cannot be easily increased. Because of this, the average particle size of hematite powder is preferably 800 μm or less. Note that the "particle size" means, if the size is 100 μm or more, the value measured according to the "General Requirements for the Test Sieving" of "JIS Z8815". If the particle size is 100 μm or less, it means the value measured by the laser diffraction particle size distribution measuring method. Specifically, the size is measured with Microtrac S3500 (Model: S3500), a measuring instrument of particle sizes and particle size distribution made by NIKKISHO Co., Ltd. by using hematite powder with a refractive index of 2.32, which is the measurement target, and water (refractive index: 1.333) as a solvent.

In the molded article for structure construction of the present invention, the molding material is not limited to particular compositions if it contains hematite 80% by mass or more and can be molded. In the process of mixing raw materials, at least one type of additives selected from among water, organic binder, and inorganic binder may be added to the molding material. This can enhance moldability of the molding material, releasability of the mold in the press molding, and precision in the shape and dimensions of the fired molded article, and can also maintain the bulk density.

Advantageous Effects of Invention

As discussed above, the present invention can provide an inexpensive molded article for structure construction, naturally exhibiting excellent radiation shielding effects, demonstrating high strength while not including harmful substances, being chemically stable, and also being suitable for use in a facility in which equipment susceptible to magnetic fields is installed. The present invention can also provide a method for manufacturing the molded article for structure construction.

DESCRIPTION OF EMBODIMENTS

1. Overview of the Molded Article for Structure Construction

A further specific explanation will be given regarding the preferred embodiments of the molded article for structure construction of the present invention and of the manufacturing method. The molded article for structure construction of the present invention is manufactured going through a particle size adjusting process, a molding material adjusting process, a molding process, and a firing process. The following sections will explain each process in detail.

1.1 Particle Size Adjustment Process

The particle size process is a process in which the particle size of hematite is adjusted before added to the molding material. The average size of hematite powder is typically from 0.3 to 800 μm for the reasons already mentioned. When adjusting the size of hematite powder to the desired average particle size of about several micrometers, the hematite powder with the desired average particle size can be obtained by firing the raw material of hematite in the form of powder in the atmosphere at the temperature from 700 to 1,200° C. for about 0.5 to 5 hours to grow hematite crystals. If the desired average particle size is reasonably large, for example, 10 μm or more, hematite powder of the desired average particle size can be obtained by the following steps: granulating the material into a form of pellets of about 5 to 10 mm; firing the pellets in the atmosphere at the temperature from 700 to 1,200° C. for about 0.5 to 5 hours and thus the pellets are sintered; and pulverizing the sintered pellets and sizing the resultant product.

1.2 Molding Material Adjusting Process

The molding material adjusting process is a process in which the molding material which includes hematite in a ratio of 80% by mass or more is manufactured. The molding material may have hematite in a ratio of 100% by mass while, as already mentioned, additives such as water, an organic binder, and an inorganic binder may be added to improve moldability of the molding material. Examples of the inorganic binder include the ones composed mainly of at least one kind of oxides selected from among alumina ($Al_2O_3$), silica ($SiO_2$) and boron oxide ($B_2O_3$). Specifically such examples include kaolinite [$Al_2Si_2O_5(OH)_4$] and halloysite [$Al_2Si_2O_5(OH)_4.2H_2O$]. However, adding excessive amount of these additives, particularly inorganic binders, may lead the degradation of bulk density, compression strength, and radiation shielding effects (attenuation coefficient) of the obtained molded article for structure construction. Therefore, the amount of additives is limited. The content of hematite in the molding material is desirably 85% by mass or more, preferably at least 90% by mass or more, even more preferably at least 95% by mass or more, and most preferably 100% by mass.

1.3 Molding Process

Upon finishing the above molding material adjusting process, the molding process follows. The molding process is a process that molds the molding material, the hematite content of which has been adjusted in the molding material adjusting process, into a molded article in a predetermined shape. The molding is not limited to particular methods but is typically carried out by press molding using a press machine. If the press molding (vacuum pressing) is carried out under a vacuum state (a reduced pressure state), the bulk density after firing can be further increased by compacting the hematite powder and other components contained in the molded article to obtain the molded article for structure construction which exhibits even better compression strength and radiation shielding effects. In addition, the compression strength of the obtained molded article for structure construction can be further improved.

The shape and the dimensions of the molded article molded in the molding process are determined as required by the application of the molded article for structure construction. For example, if the molded article for structure construction is used as a block, brick or the like, it is molded into a rectangular parallelepiped (including a cube or a quadrilateral plate), a cylinder (including a disk) or a combination of these shapes. In addition, if the molded article for structure construction is used as a tile, floorboard, ceiling panel or roofing material (such as a roofing tile), it is molded into a thick plate or a curved thick plate. In those cases where rebars, screws, or the like are expected to be inserted into the molded article for structure construction, through holes or grooves can also be formed to insert the rebars, screws and other members. A design can also be applied to the molded article for structure construction, for example, by forming indentations on the surface of the molded article. Accordingly, the shape of the molded article to be molded in the molding process is determined as required by the application of the molded article for structure construction.

1.4 Firing Process

Upon finishing the above molding process, the firing process follows. The firing process is a process that fires the molded article which has been molded into a predetermined shape in the molding press. This firing process enables the molded article to maintain the shape as a molded article for structure construction. The firing temperature of the molded article in the firing process is, as discussed above, typically from 700 to 1,350° C. In the meantime, in order to accelerate the progress of the firing of the molded article and further increase the bulk density of the fired molded article, the firing temperature is preferably 800° C. or higher. The firing temperature is more preferable 900° C. or higher and even more preferable at least 1,000° C. or higher. In order to more certainly suppress the generation of magnetite (compositional formula: $Fe_3O_4$) to make the molded article for structure construction even harder to be magnetized and being excellent also in heat resistance, the firing temperature is preferably 1,330° C. or lower and more preferably 1,300° C. or lower. This is because under the atmospheric environment, hematite exists in a stabilized phase up to around 1,330° C. without undergoing oxidation or reduction as a single element. In addition, the melting point of hematite is as high as 1,565° C. In order to more certainly inhibit generation of magnetite, the firing process is preferably carried out under the atmospheric environment (under the ambient environment with an oxygen level of 21% or more) rather than the low-oxygen ambient environment. The rate of temperature rise when raising the temperature to the desired firing temperature and the rate of temperature drop when dropping the temperature from the firing temperature to the room temperature are not limited to particular values, but an excessively high rate will make the difference in thermal expansion between the internal and the external parts of the molded article large, and thus the molded article can be easily cracked by firing. This crack is more likely to occur when dimensions of the molded article are large. Accordingly, the rates of temperature rise and drop are preferably 100° C./hour.

The firing time of the molded article in the firing process is, as discussed above, typically from 0.5 to 150 hours. In the meantime, in order to accelerate the progress of the firing of the molded article and further increase the bulk density of the fired molded article, the firing time is preferably 6 hours or more and more preferably at least 12 hours or more. However, in order to improve productivity of the molded article for structure construction, the firing time is preferably 130 hours or less and more preferably 120 hours or less. In the embodiments of the present invention, the firing time (the time from when the molded article enters into a firing furnace, or a tunnel kiln, to the time it comes out from there) is made 120 hours.

1.5 Completion

Upon finishing the above firing process, the molded article for structure construction is completed. The bulk density of the fired molded article is 2.8 $g/cm^3$ or higher, which is significantly higher than ordinary sintered oxide articles or the like. That is why the molded article for structure construction of the present invention can demonstrate high strength and excellent radiation shielding effects. In order to further improve radiation shielding effects and strength of the molded article for structure construction, the bulk density of the molded article for structure construction is preferably as high as possible. In particular, the bulk density of the molded article for structure construction is desirably 3.5 $g/cm^3$ or higher, preferably 4.0 $g/cm^3$ or higher, more preferably 4.5 $g/cm^3$ or higher, even more preferably 4.7 $g/cm^3$ or higher, still more preferably 4.8 $g/cm^3$ or higher, and most preferably 4.9 $g/cm^3$ or higher. As the following Table 3 shows, the bulk density of the fired molded article can be 5.0 $g/cm^3$ or higher. By elaborating the molding of the molded article for structure construction, for example, using the aforementioned vacuum pressing, an even higher bulk density can be obtained. Although the upper limit of the bulk density of the fired molded article is not limited to a particular value, it is impossible to make the bulk density of the fired molded article higher than the density of hematite powder (approximately 5.26 $g/cm^3$) unless a material having a higher density than hematite is mixed into the molding material.

In addition, the residual magnetization of the molded article for structure construction of the present invention can be made 1.0 $A·m^2·g^{-1}$ or less, which makes it possible to be used suitably in the environment in which equipment susceptible to magnetic fields is installed in the vicinity. The residual magnetization of the fired molded article is preferably 0.7 $A·m^2·g^{-1}$ or less, and more preferably 0.5 $A·m^2·g^{-1}$ or less and the most preferably 0.3 $A·m^2·g^{-1}$ or less. As the following Table 3 shows, the residual magnetization of the molded article for structure construction of the present invention can be made about 0.2 $A·m^2·g^{-1}$.

Furthermore, the compression strength of the molded article for structure construction of the present invention can be made 100 MPa or higher to be able to use suitably for the application that requires strength. In order to be able to apply heavier load to the molded article for structure construction without breaking it, the compression strength of the molded article for structure construction (fired molded article) is preferably 200 MPa or higher, more preferably 250 MPa or higher, and even more preferably 300 MPa or higher. As the following Table 3 shows, the compression strength of the molded article for structure construction of the present invention can be made 350 MPa or higher depending on the molding condition (press pressure). There is no upper limit to the compression strength of the molded article for structure construction while it realistically is about 400 to 500 MPa. As will be discussed later, the higher the compression strength of the molded article for structure construction is made, the higher the bulk density of the fired molding body becomes to enhance the radiation shielding effects.

1.6 Applications

The molded article for structure construction of the present invention is not limited to particular applications. As will be discussed later, the molded article for structure construction exerts superior radiation shielding effects and compression strength, and therefore can be suitably used for the application in need of radiation shielding (construction of radiation shielding structures including buildings). In particular, it can be suitably used for the application for shielding such radiation as X-rays and γ-rays which have high penetrability. In addition, because the molded article for structure construction of the present invention is very hard to be magnetized, it can also be suitably used as a foundation wall in a facility in which equipment susceptible to magnetic fields is installed. In particular, it is assumed to be used as the foundation walls of nuclear power facilities, radioactive waste treatment facilities, research or medical facilities that use radiation and strong X-rays from radioactive elements and high-energy accelerators, facilities that use high-precision analytical instruments which requires protection from such outside noise as electromagnetic waves and radiation, and of nuclear shelters. In addition, the molded article for structure construction of the present invention can facilitate construction and reduce a construction period, which makes it suitable for the use in the applications in need of urgency. For example, it can be suitably used as a molded article for constructing the radiation shielding structure to build the structure for surrounding a temporary storage facility of waste materials contaminated with radioactive substances. The use of the molded article for structure construction of the present invention is expected to resolve the shortage of temporary storage facilities for the waste materials contaminated with radioactive substances, caused by accidents of nuclear power stations. Moreover, the molded article for structure construction of the present invention can be used as an artificial reef, foundation and a protective wall of a heavy structure or the like, focusing attention on the high bulk density, corrosion resistance (chemical stability) and great strength. The molded article for structure construction of the present invention can also be used as a tile for the external wall of general buildings or as a housing material, focusing attention on the designability and the nontoxic property.

DESCRIPTION OF EMBODIMENTS

2. Test Method
2.1 Samples

In order to evaluate the properties of the molded article for structure construction of the present invention including radiation shielding effects, samples were fabricated for Examples 1 through 9 and Comparative Examples 1 and 2 of Table 1, and the each sample was measured in the bulk density, compression strength, attenuation coefficient, saturation magnetization, and residual magnetization. The specific methods of measuring bulk density, compression strength, attenuation coefficient, saturation magnetization, and residual magnetization will later be described.

TABLE 1

|  | Composition of Molding Material | Molding Condition | Firing Temperature |
| --- | --- | --- | --- |
| Example 1 | Hematite: 100 wt % Kaolinite: 0 wt % | A | 1,280° C. |
| Example 2 | Hematite: 100 wt % Kaolinite: 0 wt % | B | 1,280° C. |
| Example 3 | Hematite: 100 wt % Kaolinite: 0 wt % | C | 1,280° C. |
| Example 4 | Hematite: 100 wt % Kaolinite: 0 wt % | C | 1,200° C. |
| Example 5 | Hematite: 95 wt % Kaolinite: 5 wt % | C | 1,200° C. |
| Example 6 | Hematite: 85 wt % Kaolinite: 15 wt % | C | 1,200° C. |
| Example 7 | Hematite: 100 wt % Kaolinite: 0 wt % | C | 1,100° C. |
| Example 8 | Hematite: 95 wt % Kaolinite: 5 wt % | C | 1,100° C. |
| Example 9 | Hematite: 85 wt % Kaolinite: 15 wt % | C | 1,100° C. |

TABLE 1-continued

|  | Composition of Molding Material | Molding Condition | Firing Temperature |
| --- | --- | --- | --- |
| Comparative Example 1 | Ferrite: 100 wt % Kaolinite: 0 wt % | C | 1,280° C. |
| Comparative Example 2 | Ferrite: 95 wt % Kaolinite: 5 wt % | C | 1,280° C. |

The samples of Examples 1 through 9 in the Table 1, have been made by adding kaolinite [$Al_2Si_2O_5(OH)_4$] to hematite in the ratio of 0% by mass, 5% by mass, and 15% by mass, molding the materials with the molding conditions A, B, and C, and firing them in the atmospheric environment at the temperatures 1,100° C., 1,200° C., and 1,280° C. for 120 hours. All of the samples are included in the technical scope of the present invention. The samples of Comparative Examples 1 and 2 have been made by adding kaolinite [$Al_2Si_2O_5(OH)_4$] to ferrite in the ratio of 0% by mass and 5% by mass, molding the materials with the molding condition C and firing them in the atmospheric environment at the temperature 1,280° C. for 120 hours. For reference, the following Table 2 shows the percentage of the impurity content of the hematite and ferrite (strontium ferrite) used in the test. The impurity content has been measured by the X-ray fluorescence spectrometer (model: ZSX100e) of Rigaku Corporation. Each value in Table 2 is the value converted from the quantity of the each element quantified by the fluorescence analysis to the most stable oxides under an ordinary temperature and pressure.

TABLE 2

| Element | Hematite (wt %) | Ferrite (wt %) |
| --- | --- | --- |
| $Fe_2O_3$ | 99.139 | 88.4 |
| $SiO_2$ | 0.018 | 0.01 |
| SrO | — | 10.9 |
| $Al_2O_3$ | 0.125 | 0.04 |
| $Na_2O$ | — | 0.01 |
| $TiO_2$ | — | — |
| MnO | 0.357 | 0.31 |
| BaO | — | 0.12 |
| $K_2O$ | — | 0.01 |
| CaO | 0.148 | 0.02 |
| $ZrO_2$ | — | — |
| $Cr_2O_3$ | 0.054 | 0.05 |
| $P_2O_5$ | 0.139 | 0.01 |
| $SO_3$ | 0.011 | 0.03 |
| MgO | — | 0.01 |
| NiO | — | 0.02 |
| $V_2O_5$ | — | — |
| Cl | 0.009 | 0.01 |

In Table 1, the molding condition "A" means a "50 t press (applied once)," "B" a "150 t press (applied once)," "C" a "300 t press (applied eight times)," and "D" a "300 t press (applied six times)". The 50 t press was carried out using the pipe press system (model: PS70) of Mitsuishi Fukai Iron Works, Co., Ltd., for the 150 t press, the friction press system (model: F150T) of Mitsuishi Fukai Iron Works, Co., Ltd., and for the 300 t press, the vacuum press (model: 3V CFOP-1E) of Mitsuishi Fukai Iron Works, Co., Ltd. All of the press used the press mold with the size of a length of 230 mm×a width of 114 mm×a height (varying with the powder fill volume). Because of this, the press pressure of the 50 t was about 18.7 MPa, of the 150 t press was about 56 MPa, and of the 300 t was about 112 MPa.

2.2 Measurement Method of Bulk Density

Meanwhile, the bulk density was measured by the following method. First, each of the samples of Examples 1 through 9 and Comparative Examples 1 and 2 in Table 1 (the ones molded and fired) was cut with a diamond cutter into a piece with the size of a length of 100 mm×a width of 100 mm×a height of 100 mm to fabricate the cubed samples for measuring the bulk density. The bulk density of each sample for measuring the bulk density was measured using the vacuum method described in "JIS R2205-1992", entitled "Testing method for apparent porosity, water absorption, and specific gravity of refractory bricks".

2.3 Measurement Method of Compression Strength

The compression strength was measured according to the "Testing methods for cold compressive strength of refractory bricks" of "JIS R2206" using the compression strength tester (No. 212445) of Tokyo Testing Machine.

2.4 Measurement Method of Attenuation Coefficient

The attenuation coefficient was measured by the following γ-rays penetration test. First, each of the samples of Examples 1 through 9 and Comparative Examples 1 and 2 (the ones molded and fired) in Table 1 was cut into the plate with the size of a length of 10 cm×a height of 10 cm×a thickness of 1 cm to fabricate plate samples for measuring the attenuation coefficient. Then, the attenuation coefficient was measured for each sample for measuring the attenuation coefficient. Cs-137 (8.10 E+03 Bq) and Co-60 (4.32 E+03 Bq), which are the standard γ-ray sources of the Japan Radioisotope Association, were used as the standard radiation sources. The low-background pure germanium semiconductor detector "Canberra GC1520" manufactured by Canberra was used as a measuring instrument. The line analysis software "wPKarea 2006" was used for analyzing the measurement result. The values of the attenuation coefficient have been calculated from the following Formula 1. In Formula 1, $I_0$ is the number of the count (the number of the background count) where the measurement is done without the sample for measuring the attenuation coefficient being set in the measuring equipment while I is the number of the count where the measurement is done with the sample for measuring the attenuation coefficient being set in the measuring equipment. In addition, x is the thickness (unit: cm) of the sample for measuring the attenuation coefficient.

[Formula 1]

$$\mu = \frac{1}{x}\ln\left(\frac{I_0}{I}\right) \quad \text{Formula 1}$$

2.5 Measurement Method of Saturation Magnetization and Residual Magnetization

The saturation magnetization and the residual magnetization were measured by the following method. First, each sample of Examples 1 through 9 and Comparative Examples 1 and 2 in Table 1 (the ones molded and fired) were crashed into pieces with a hammer, and the fragments with a mass of about 100 mg were selected as the samples for measuring magnetization. Then, the magnetization curves (hysteresis curves) were traced for each sample for measuring magnetization by reading magnetization in which the external magnetic field was applied to the maximum field strength at 800 kA·m$^{-1}$ at the sweeping rate of 800 kA·m$^{-1}$·min$^{-1}$, to calculate the saturation magnetization and the residual magnetization from each magnetization curve. The high sensitivity vibrating sample magnetometer (VSM-P7-15) made by Toei Industry, Co., Ltd. was used for measuring magnetization.

3. Test Results

Table 3 shows the bulk density, compression strength, attenuation coefficient, saturation magnetization and residual magnetization of the samples of Examples 1 through 9 and Comparative Examples 1 and 2 measured by the methods described above.

TABLE 3

| | Bulk Density g·cm$^{-3}$ | Compression Strength MPa | Attenuation Coefficient cm$^{-1}$ | | | Saturation Magnetization A·m$^2$·g$^{-1}$ | Residual Magnetization A·m$^2$·g$^{-1}$ |
| | | | Cs-137 662 keV | Co-60 1,173 keV | Co-60 1,332 keV | | |
| --- | --- | --- | --- | --- | --- | --- | --- |
| Example 1 | 4.92 | 353 | 0.371 | 0.336 | 0.323 | 0.5 | 0.3 |
| Example 2 | 4.93 | 354 | 0.381 | 0.338 | 0.325 | 0.5 | 0.3 |
| Example 3 | 5.05 | 388 | 0.388 | 0.369 | 0.342 | 0.5 | 0.2 |
| Example 4 | 4.68 | 335 | 0.366 | 0.311 | 0.279 | 0.6 | 0.3 |
| Example 5 | 4.15 | 282 | 0.308 | 0.244 | 0.227 | 0.4 | 0.3 |
| Example 6 | 3.49 | 204 | 0.231 | 0.190 | 0.173 | 0.5 | 0.2 |
| Example 7 | 4.38 | 290 | 0.327 | 0.282 | 0.250 | 0.6 | 0.3 |
| Example 8 | 3.91 | 251 | 0.281 | 0.225 | 0.201 | 0.5 | 0.3 |
| Example 9 | 2.91 | 128 | 0.164 | 0.144 | 0.131 | 0.6 | 0.2 |
| Comparative Example 1 | 4.78 | 347 | 0.385 | 0.293 | 0.277 | 57.2 | 35.0 |
| Comparative Example 2 | 4.58 | 265 | 0.355 | 0.274 | 0.261 | 53.8 | 32.3 |
| Comparative Example 3 | 2.10 | — | 0.161 | 0.126 | 0.116 | — | — |
| Comparative Example 4 | 11.34 | — | 1.130 | 0.711 | 0.616 | — | — |

* The figures with wavy underlines in the table indicate literature values.

In addition, Comparative Examples 3 and 4 are shown in Table 3 for reference purposes. Comparative Example 3 is the attenuation coefficient of concrete (the molded article with the bulk density 2.1 g/cm$^2$) calculated with the calculation method described in the "Practical Manual on Shielding Calculation of Radiation Facilities" (written, edited, and published by Nuclear Safety Technology Center and the Editing Committee for the Publication of the Law Concerning Prevention of Radiation Hazards; printed and binded by Sobunsha, Co., Ltd.; published in March 2007), using the literature value described in the manual while Comparative Example 4 is the attenuation coefficient of lead (the molded article with the bulk density 11.34 g/cm$^3$) calculated by the same calculation method.

4. Examination of the Test Results

The result of the experiment in Table 3 will now be examined.

4.1 Utility of Hematite

First, the utility of hematite is examined. The test results of Example 3 and Comparative Examples 1 and 2 are compared to each other in Table 3. The sample of Example 3 has the hematite content in the ratio of 100% by mass, the firing temperature at 1,280° C., and the molding condition "C". The sample of the Comparative Example 1 has the ferrite content in the ratio of 100% by mass, and the same firing temperature and the molding condition (press pressure) as the sample of Example 3. The sample of the Comparative Example 2 has the ferrite content in the ratio of 95% by mass and the same firing temperature and the molding condition (press pressure) as the sample of the Example 3. The comparison shows that Example 3 has higher values than Comparative Examples 1 and 2 in any of the items of the bulk density, compression strength, and attenuation coefficients [Cs-137 (662 keV), Co-60 (1,173 keV) and Co-60 (1,332 keV)]. This confirms that it is preferable to add hematite rather than ferrite in order to increase the bulk density, the compression strength, and the attenuation coefficient in the same conditions such as the firing temperature and the molding condition (press pressure).

In addition, the attenuation coefficient of the samples of Examples 1 through 9 and Comparative Examples 4 and 5 are compared to each other in Table 3. Although the attenuation coefficients of Examples 1 through 9 are not as high as the sample of Comparative Example 4, which is made of lead, the metal, the figures are found to be considerably superior to those of Comparative Example 3, the sample of which is made of commonly available concrete as a structural material for constructing radiation shielding structures.

In addition, Table 3 shows that the sample of Example 3 has the saturation magnetization at 0.5 A·m$^2$·g$^{-1}$ and the residual magnetization at 0.2 A·m$^2$·g$^{-1}$, indicating the sample is in the non-magnetized state within the range of measurement error. In the same way as the sample of Example 3, the samples of Examples 1, 2 and 4 through 9 containing hematite can be said almost to be in the non-magnetized state. In contrast, the samples of Comparative Examples 1 and 2 are found to be permanently magnetized to a remarkable level. In particular, the sample of Comparative Example 1 has the saturation magnetization of 57.2 A·m$^2$·g$^{-1}$ and the residual magnetization of 35.0 A·m$^2$·g$^{-1}$ while the sample of Comparative Example 2 has the saturation magnetization of 53.8 A·m$^2$·g$^{-1}$ and the residual magnetization of 32.3 A·m$^2$·g$^{-1}$. This confirms that the molded article for structure construction containing ferrite becomes permanent magnet once exposed to the magnetic field while the molded article for structure construction containing hematite never becomes permanent magnet even exposed to the magnetic field.

4.2 Influence of Molding Conditions (Press Pressure)

This section examines the influence of the molding condition (press pressure). The samples of Examples 1, 2, and 3 have been molded using the molding material of same composition at the same firing temperature but under the different press pressure. Therefore, the comparison of these samples can evaluate how the difference in the press pressure can influence the properties of the molded article for structure construction, for example, in the bulk density, the compression strength, and the attenuation coefficient. Specifically, the comparison of the test results on the samples of Example 1, 2, and 3 in Table 3 confirmed that Example 1, 2, and 3 have higher values in the ascending order in any of the items of the bulk density, compression strength, and attenuation coefficients [Cs-137 (662 keV), Co-60 (1,173 keV) and Co-60 (1,332 keV)]. As Table 1 shows, the molding condition of the sample of Example 1 is "A" (50 t press applied once), the molding condition of the sample of Example 2 is "B" (150 t press applied once), and the molding condition of the sample of Example 3 is "C" (300 t press applied eight times). In other words, the press pressure for molding the molding material is higher in the order of Example 1, 2, and 3. This confirms that the higher the press pressure is applied when molding the molding material, the higher the bulk density, compression strength, and attenuation coefficient become in the molded article for structure construction.

4.3 Influence of Firing Temperature

This section examines the influence of the firing temperature. The samples of Examples 3, 4, and 7 have been molded using the molding material of the same composition under the same molding condition but at the different firing temperature. Therefore, the comparison of these samples can evaluate how the difference in the firing temperature can influence the properties of the molded article for structure construction, for example, in the bulk density, the compression strength, and the attenuation coefficient. Specifically, the comparison of the test results on the samples of Example 3, 4, and 7 in Table 3 confirmed that Example 7, 4, and 3 have higher values in the ascending order in any of the items of the bulk density, compression strength, and attenuation coefficients [Cs-137 (662 keV), Co-60 (1,173 keV) and Co-60 (1,332 keV)]. As Table 1 shows, the firing temperatures of the sample of Example 3 is 1,280° C., the sample of Example 4 is 1,200° C., and the sample of Example 7 is 1,100° C. In other words, the firing temperature is higher in the order of Example 7, 4, and 3. This confirms that the higher the firing temperature is applied, the higher the bulk density, the compression strength, and the attenuation coefficient become in the molded article for structure construction.

4.4 Influence of Composition of Molding Material (Hematite Content)

This section examines the influence of the composition of the molding material (hematite content). The samples of Example 4, 5, and 6 have been molded with the same molding condition at the same firing temperature (1,200° C.) but using the material with different hematite contents. Therefore, the comparison of these samples can evaluate how the difference in the hematite content can influence the properties of the molded article for structure construction, for example, in the bulk density, the compression strength, and the attenuation coefficient. Specifically, the comparison of the test results on the samples of Example 4, 5, and 6 in Table 3 confirmed that Example 6, 5, and 4 have higher values in the ascending order in any of the items of the bulk density, compression strength, and attenuation coefficients [Cs-137 (662 keV), Co-60 (1,173 keV) and Co-60 (1,332 keV)]. As Table 1 shows, the content of hematite in the sample of Example 4 is 100% by mass, the sample of the Example 5 is 95% by mass, and the sample of the Example 6 is 85% by mass. In other words, the content of hematite is higher in the order of Example 6, 5, and 4. This confirms that the higher the content of hematite is applied, the higher the bulk density, the compression strength, and the attenuation coefficient become in the molded article for structure construction. The comparison of the test results on the samples of Examples 7, 8, and 9, which have been molded with the same molding condition at the same firing temperature (1,100° C.) using the molding material with different compositions, has also drawn the same conclusion as the comparison of the test results of the samples of Example 4, 5, and 6.

4.5 Relationship Between Bulk Density, Compression Strength and Attenuation Coefficient Lastly, this section examines the relationship between bulk density, compression strength and attenuation coefficient. The comparison of the samples of Examples 1 through 9 in Table 3 in the bulk density, compression strength, and attenuation coefficient has revealed that the attenuation coefficients of Example 1, 2, 3, 4, and 7, in which the bulk density is 4.3 g/cm³ or higher and the compression strength is 250 MPa or higher, are significantly higher than those of Example 5, 6, 8, 9. In particular, the attenuation coefficients of Example 5, 6, 8, and 9 do not exceed 0.308 cm$^{-1}$ in Cs-137 (662 keV), 0.244 cm$^{-1}$ in Co-60 (1,173 keV) and 2.27 cm$^{-1}$ in Co-60 (1,332 keV) while those of Example 1, 2, 3, 4, and 7 all show higher values 0.327 cm$^{-1}$ or more in Cs-137 (662 keV), 0.282 cm$^{-1}$ or more in Co-60 (1,173 keV), and 2.50 cm$^{-1}$ or more in Co-60 (1,332 keV). In particular, the attenuation coefficient of the sample of Example 3 exhibits a distinctly high value. This confirms that the higher the bulk density and the firing temperature are applied, the higher the attenuation coefficient becomes in the molded article for structure construction which improves the radiation shielding effects.

4.6 Conclusion

The above results confirm that the molded article for structure construction of the present invention is suitable for the use in a facility in which equipment susceptible to magnetic fields is installed because it does not only exhibit the excellent radiation shielding effects but also never becomes magnetized. The results also confirms that, in order to obtain better radiation shielding effects on the molded article for structure construction of the present invention, the molding material can preferably be molded with a higher content of hematite at an increased press pressure and fired at around 1,280° C. to increase the bulk density and the compression strength of the fired molded article (the molded article for structure construction).

The invention claimed is:

1. A brick for constructing a γ-ray shielding structure or constructing an X-ray shielding structure that is obtained by press molding a molding material containing hematite in a ratio of 90% by mass or more into a predetermined shape to obtain a molded article, and firing the molded article, so that the compression strength of the fired molded article is 250 MPa or more, the bulk density of the fired molded article is 4.3 g/cm³ or higher, the fired molded article having a residual magnetization of 1.0 A·m²·g$^{-1}$ or less.

2. The brick according to claim 1, wherein a firing temperature of the molded article is from 700 to 1,350° C. and a firing time of the molded article is from 0.5 to 150 hours.

3. The brick according to claim 1, wherein hematite is contained in the molding material in a form of powder with an average particle size from 0.3 to 800 μm.

4. The brick according to claim 1, wherein at least one type of additive selected from among water, an organic binder, and an inorganic binder is added to the molding material.

5. A tile for constructing a γ-ray shielding structure or constructing an X-ray shielding structure that is obtained by press molding a molding material containing hematite in a ratio of 90% by mass or more into a predetermined shape to obtain a molded article, and firing the molded article, so that the compression strength of the fired molded article is 250 MPa or more, the fired molded article has a bulk density of 4.3 g/cm³ or higher, and the fired molded article having a residual magnetization of 1.0 A·m²·g$^{-1}$ or less.

6. A floorboard for constructing a γ-ray shielding structure or constructing an X-ray shielding structure that is obtained by press molding a molding material containing hematite in a ratio of 90% by mass or more into a predetermined shape to obtain a molded article, and firing the molded article, so that the compression strength of the fired molded article is 250 MPa or more, the fired molded article has a bulk density of 4.3 g/cm³ or higher, and the fired molded article having a residual magnetization of 1.0 A·m²·g$^{-1}$ or less.

7. A ceiling panel for constructing a γ-ray shielding structure or constructing an X-ray shielding structure that is obtained by press molding a molding material containing hematite in a ratio of 90% by mass or more into a predetermined shape to obtain a molded article, and firing the molded article, so that the compression strength of the fired molded article is 250 MPa or more, the fired molded article has a bulk density of 4.3 g/cm³ or higher, and the fired molded article having a residual magnetization of 1.0 A·m²·g$^{-1}$ or less.

8. A roofing material for constructing a γ-ray shielding structure or constructing an X-ray shielding structure that is obtained by press molding a molding material containing hematite in a ratio of 90% by mass or more into a predetermined shape to obtain a molded article, and firing the molded article, so that the compression strength of the fired molded article is 250 MPa or more, the fired molded article has a bulk density of 4.3 g/cm³ or higher, and the fired molded article having a residual magnetization of 1.0 A·m²·g$^{-1}$ or less.

9. A method for manufacturing a brick, a tile, a floorboard, a ceiling panel, or a roofing material for constructing a γ-ray shielding structure or constructing an X-ray shielding structure, the method comprising the steps of: molding a molding material containing hematite in a ratio of 90% by mass or more into a predetermined shape to obtain a molded article; and firing the molded article, so that the fired molded article has a bulk density of 2.8 g/cm³ or higher, the fired molded article having a residual magnetization of 1.0 A·m²·g$^{-1}$ or less.

* * * * *